United States Patent [19]

Tirone

[11] Patent Number: 5,014,084
[45] Date of Patent: May 7, 1991

[54] APPARATUS FOR FORMING IMAGES ON PLAIN PAPER

[75] Inventor: George F. Tirone, Miamisburg, Ohio

[73] Assignee: The Mead Corporation, Dayton, Ohio

[21] Appl. No.: 467,061

[22] Filed: Jan. 18, 1990

[51] Int. Cl.$^5$ ............................................. G03B 27/32
[52] U.S. Cl. ...................................... 355/27; 355/106
[58] Field of Search ...................... 355/27, 28, 32, 100, 355/106, 430/138, 211

[56] References Cited

U.S. PATENT DOCUMENTS 4,842,976  6/1989  Sanders et al. ...................... 430/138

FOREIGN PATENT DOCUMENTS 2202641  9/1988  United Kingdom .................. 355/27

Primary Examiner—A. A. Mathews
Assistant Examiner—D. Rutledge
Attorney, Agent, or Firm—Thompson, Hine and Flory

[57] ABSTRACT

A cylithographic copying apparatus includes a coil comprising continuous webs if imaging sheet and intermediate developer sheet formed in a spiral having alternating layers of imaging and intermediate developer sheet. The laminate formed of imaging and intermediate developer sheet is payed out from the coil past a developer station, where it is image-wise exposed, and through pressure rollers which form an image on the intermediate developer sheet. The intermediate developer sheet is conveyed to an assembling station where the imaged developer layer is transferred to a sheet of plain paper. In a preferred embodiment, the imaging sheet includes a support of polyethylene terephthalate (PET) and the intermediate developer sheet includes a substrate of aluminized PET. The coil preferably is rotatably mounted within a cassette which also includes a take-up spool for the spent imaging sheet; the cassette is easily insertable and removable from the copier housing.

7 Claims, 2 Drawing Sheets

APPARATUS FOR FORMING IMAGES ON PLAIN PAPER

BACKGROUND OF THE INVENTION

The present invention relates to imaging systems and, more particularly, to apparatus for developing an image on plain paper wherein a color precursor is associated with an imaging sheet in an image-wise pattern and a film of developer material is subsequently associated with the imaging sheet to produce an image.

Photosensitive imaging systems employing microencapsulated, radiation-sensitive compositions, also known as cylithographic imaging systems, are the subject of U.S. Pat. Nos. 4,399,209; 4,772,541 and 4,842,976; commonly assigned to The Mead Corporation. These imaging systems are characterized in that an imaging sheet, including a layer of microcapsules containing a photosensitive composition in the internal phase, is image-wise exposed to actinic radiation. In the most typical embodiments, the photosensitive composition is a photopolymerizable composition including a polyethylenically unsaturated compound and a photoinitiator and is encapsulated with a color precursor. Exposure image-wise hardens the internal phase of the microcapsules. Following exposure, the imaging sheet is subjected to a uniform rupturing force by placing the sheet in contact with a layer of developer material on an intermediate developer sheet and passing the sheets through the nip of a pair of pressure rollers, whereupon the color precursor is transferred to the developer sheet where it reacts to form an image.

U.K. Patent Application GB A 2202641 discloses an apparatus for copying on plain paper or cloth using the cylithographic system wherein a wax is incorporated in the developer layer. In one embodiment, the apparatus performs two transfer steps. First, the developer layer of an intermediate developer sheet is transferred to plain paper by passing the developer sheet and paper between pressure rollers. Second, the image-wise exposed imaging sheet is juxtaposed to the plain paper to form an image on the paper. In another embodiment, both the microcapsules and developer are layered on a recording medium which is image-wise exposed. The layers are passed through pressure rollers and the developed image is transferred to plain paper by passing the recording medium and paper through a second set of pinch rollers.

SUMMARY OF THE INVENTION

The invention is an apparatus for forming images on plain paper which minimizes the space required for rolls of imaging sheet and intermediate developer sheet. The imaging sheet and intermediate developer sheet are in the form of continuous webs which are juxtaposed to each other into a laminate and spirally wound into a coil such that the windings of the coil are made up of alternate layers of imaging sheet and intermediate developer sheet. The coil is rotatably mounted on the copying apparatus and the laminate sheet is payed out past an exposure station, where the imaging sheet is image-wise exposed, and a developer station, where the microcapsules of the imaging sheet are ruptured by pressure rollers to transfer an image-wise pattern of color precursor to the developer layer.

The laminate subsequently is separated into the spent imaging sheet and intermediate developer sheet, and the image carried by the intermediate developer sheet is transferred to plain paper sheets by passing the intermediate developer sheet and plain paper sheet through a set of fuser rollers.

In a preferred embodiment, the copying apparatus includes a cassette cartridge which houses the coil of imaging and intermediate developer sheets, as well as a take-up spool for spent imaging sheet. Accordingly, the replacement of both imaging and intermediate developer sheets is facilitated.

Also in the preferred embodiment, the imaging sheet includes a support of polyethylene terephthalate (PET) and the intermediate developer sheet includes a substrate of aluminized PET. When brought past the exposure station, activating radiation, preferably visible light radiation, bearing an image is transmitted through the PET support of the imaging sheet to photoharden or photosoften the microcapsules on the sheet. Further, the activating radiation is reflected from the aluminized PET substrate of the intermediate developer sheet back to the imaging sheet, thereby increasing the effectiveness of the transmitted radiation.

Accordingly, it is an object of the present invention to provide a cylithographic copying apparatus in which the imaging and intermediate developer sheets are concentrically wound into a spiral for minimizing the volume taken up by the sheets; a cylithographic copying apparatus in which the spiral of imaging and intermediate developer sheets, as well as a take-up spool, is contained within a replaceable cassette; a cylithographic copying apparatus wherein the imaging sheet includes an aluminized PET support and the intermediate developer sheet includes an aluminized PET substrate so that image-bearing radiation may be transmitted through the imaging sheet and reflected back to the imaging sheet from the intermediate developer sheet; and a cylithographic copying apparatus which is compact and possesses a geometry which facilitates ease in serviceability.

Other objects and advantages will be apparent from the following description, the accompanying drawings and the appended claims.

DETAILED DESCRIPTION

Figure 1:
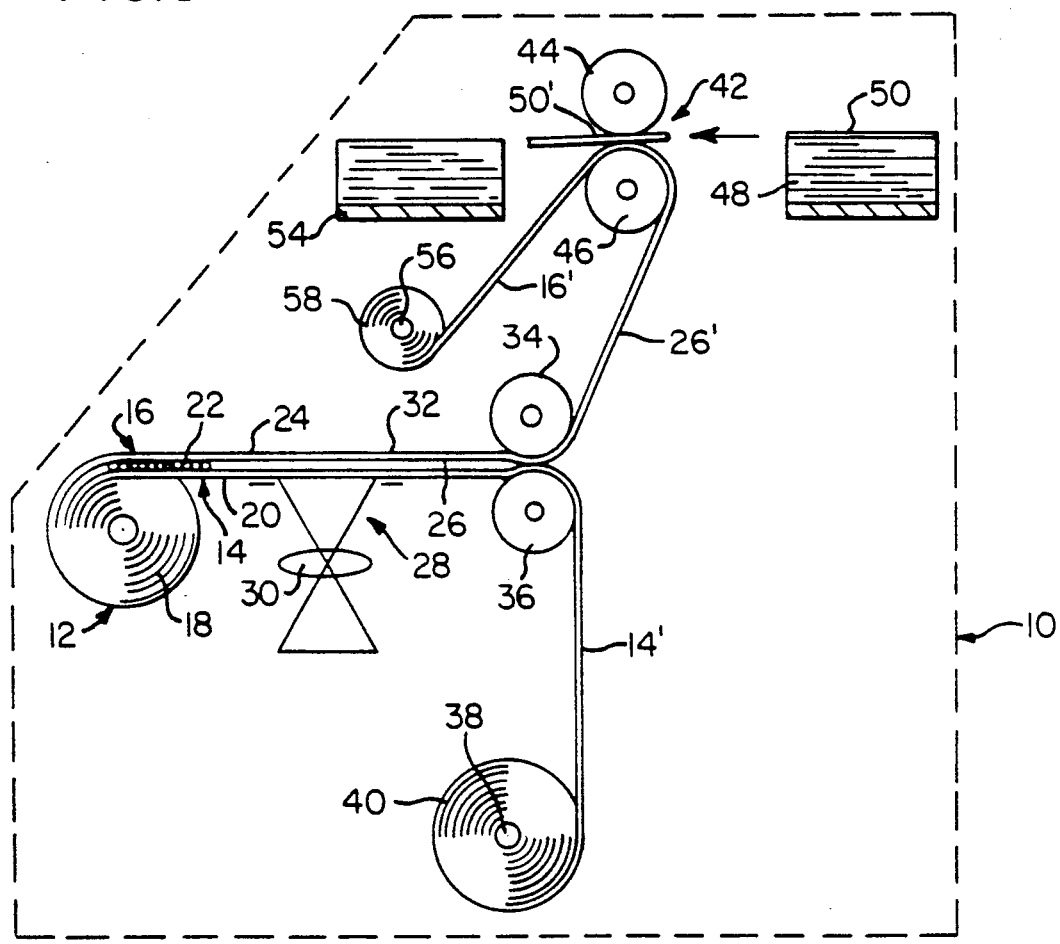
FIG. 1 is a schematic side elevation of a preferred embodiment of the cylithographic copying apparatus of the present invention.

As shown in FIG. 1, the apparatus for forming images on plain paper includes a housing, generally designated 10, for enclosing the components of the copying apparatus. A coil 12 comprises webs of imaging sheet 14 and intermediate developer sheet 16 which are juxtaposed and formed into a spiral 18 having alternating layers of imaging sheet and intermediate developer sheet. Imaging sheet 14 comprises a support 20 made of PET which is coated with a layer of microcapsules 22. Preferably, the layer of microcapsules contains three sets of microcapsules, alternately sensitive to red, green and blue light and containing cyan, magenta and yellow image-forming agents.

The intermediate developer sheet 16 includes a substrate 24 of aluminized PET. The intermediate developer sheet 16 is coated with a layer 26 of developer material which preferably includes a phenolic or functionalized acrylic or vinylic resin. Examples of such resins are disclosed in U.S. Pat. Nos. 4,853,364 and 4,877,767. The imaging sheet 14, intermediate developer sheet 16 and microcapsules 22 are disclosed in greater detail in U.S. Pat. Nos. 4,399,209; 4,440,846; 4,772,530; 4,772,541; and 4,842,976, the disclosures of which are incorporated herein by reference.

The apparatus 10 includes an exposure station, generally designated 28, which includes a source 30 of activating radiation, preferably visible light radiation. A laminate 32 comprises the juxtaposed webs 14, 16 of imaging sheet and intermediate developer sheet, respectively, oriented such that the layer of microcapsules 22 faces the layer 26 of developer material. The laminate 32 is payed out through the exposure station 28 where image-bearing radiation is transmitted from source 30.

The radiation passes through the PET support 20 of the imaging sheet 14 and is reflected back from the aluminized substrate 24 of intermediate developer sheet 16 to impinge upon the microcapsules 22. The image-bearing radiation image-wise irradiates selected microcapsules and immobilizes by gelling or solidification the color precursor they contain; the color precursor contained in the non-irradiated microcapsules remains liquid. It is within the scope of the invention to provide an aluminized PET support for imaging sheet 14 and a transparent PET substrate for intermediate developer sheet 16, in which case the radiation source would be positioned on the side of the resulting laminate opposite that shown in FIG. 1. The reflection of radiation from the aluminized surface could enhance the exposure of the microcapsules as well as the embodiment shown.

The exposed laminate 32 passes from the exposure station 28 to a pair of pressure rollers 34, 36 which apply a uniform rupturing force to the non-irradiated microcapsules to transfer to the developer layer 26 of the developer-donor sheet 16. Upon transfer of the internal phase of the microcapsules 22 to the developer layer 26, the chromogenic material forms a visible image in the developer layer 26'.

The laminate 32 is now separated, the spent imaging sheet 14' being collected upon a spool 38 into a coil 40, and the intermediate developer sheet 16 progressing to an assembly station, generally designated 42.

The assembling station 42 includes fuser rollers 44, 46, preferably both of which are heated, and a source 48 of sheets 50 of a non-reactive support, preferably plain paper. It is within the scope of the invention to provide a single one of rollers 44, 46 being heated, and to provide a source of sheets comprising a roll of paper. The intermediate developer sheet 16 passes through the nip 54 between the rollers 44, 46 along with a sheet of plain paper 50. The developer layer 26' bearing an image is transferred and fixed to the sheet of plain paper by the fuser rollers 44, 46. The fuser rollers 44, 46 typically may include a source of heat energy, such as heat lamps, electric resistance elements or hot air. The image-bearing sheets 50' are then collected onto a tray 54. The spent intermediate developer sheet 16' is collected onto a spool 56 in a coil 58.

Figure 2:
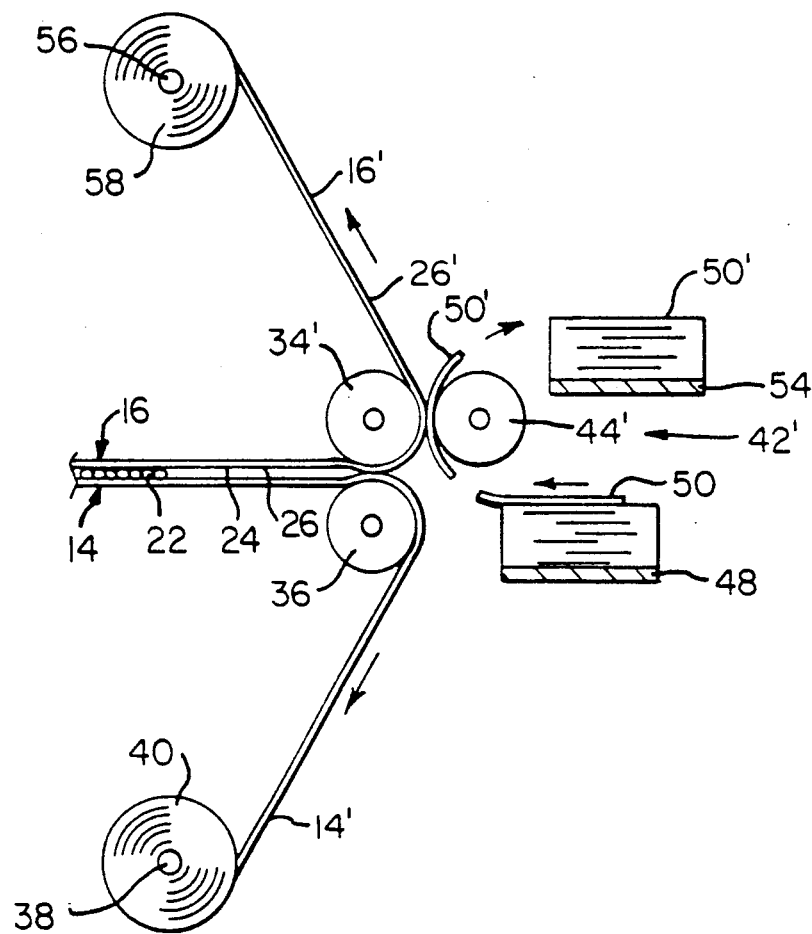
FIG. 2 is a detail showing a modification of the apparatus of FIG. 1.

As shown in FIG. 2, in an alternate embodiment of the invention of FIG. 1, assembling station 42' includes a set of pressure rollers 34', 44', pressure roller 34' being common to the pair of pressure rollers 34', 36 which rupture the microcapsules 22 carried on imaging sheet 14. Spent intermediate developer sheet 16' is collected upon spool 56 and spent imaging sheet 14' is collected upon spool 34. For the sake of clarity, glosser 52 (see FIG. 1) is not shown but nevertheless would be included in the assembly of FIG. 2.

Figure 3:
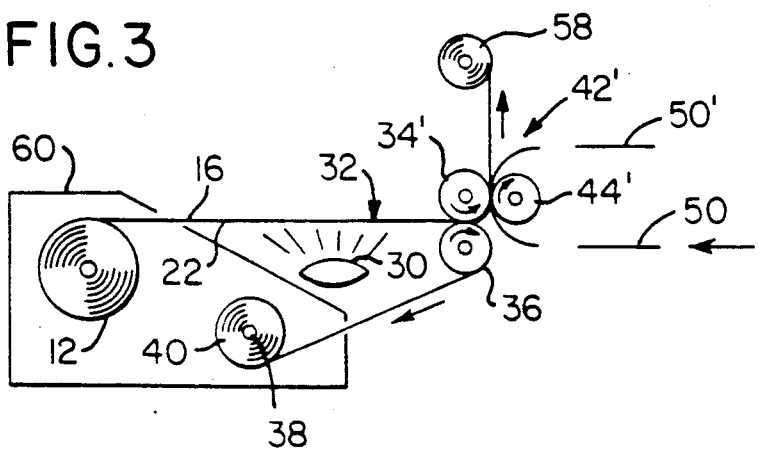
FIG. 3 is a detail showing a further modification of the apparatus of FIG. 1.

FIG. 3 shows the coil 12 and the take up spool 38 rotatably mounted within a cassette 60 which is removable from apparatus 10 and replaceable with a cassette of unspent sheets 14, 16. In all other respects, the geometry of the apparatus is substantially as shown in FIG. 2.

With reference to FIG. 1, the operation of the invention is as follows. A coil 12 of imaging sheet 14 and intermediate developer sheet 16 is loaded into the apparatus 10. A laminate 32 of webs 14, 16 is payed out past the exposure station 28. Image-bearing radiation is emitted from the source 30 to image-wise expose the imaging sheet 14. The laminate passes into the nip of the rollers 34, 36 where the non-exposed microcapsules are ruptured and the dye precursor they contain is transferred to the developer layer 26 of the web 16. The developer layer 26', now bearing an image, is conveyed with the developer sheet 16 to the assembling station 42 where the layer 26' is transferred to a sheet 50 of plain paper by passing the combination through pressure rollers 44, 46 such that the layer 26' is brought into intimate contact with the sheet 50.

The sheet 50', now bearing the layer 26', is passed through a glosser 52 which fixes the image to the sheet 50'.

The embodiment of FIG. 3 varies the aforementioned procedure in that, prior to start-up, the cassette 60 is loaded into the apparatus 10 and the laminate 32 threaded through the pressure rollers 34, 36. The laminate 32 is separated at pressure rollers 34' 36 and the imaging sheet 16 is threaded into the spool 38. The apparatus operates as previously described with reference to FIG. 1.

While the forms of apparatus herein described constitute preferred embodiments of the invention, it is to be understood that the invention is not limited to these precise forms of apparatus, and that changes may be made therein without departing from the scope of the invention.

What is claimed is:

1. An apparatus for forming an image on plain paper comprising:
   a continuous web of imaging sheet having a support with a layer of photosensitive microcapsules on a surface thereof, said microcapsules containing a photohardenable or photosoftenable composition and a color precursor;
   a continuous web of intermediate developer sheet having a substrate with a layer on a surface thereof of a thermoplastic developer resin, said resin being capable of reacting with said color precursor to form an image;
   said webs of said imaging and intermediate developer sheets being juxtaposed into a laminate and spirally wound into a coil such that windings thereof are alternately said imaging sheet and said intermediate developer sheet;
   means for rotatably mounting said coil on said apparatus and paying out said laminate from said coil;
   means for image-wise exposing said imaging sheet component of said payed-out laminate;
   means for applying a uniform rupturing force to said image-wise exposed laminate sufficient to cause said microcapsules to rupture and transfer an image-wise pattern of said color precursor to said developer layer, thereby forming an image thereof, said applying means including a pair of pressure rollers;

means for separating said laminate into said imaging sheet and said intermediate developer sheet bearing said image; and means for assembling said intermediate developer sheet bearing said image with a non-reactive support and applying sufficient heat energy to said intermediate developer sheet and said non-reactive support to transfer said resin layer of said intermediate developer sheet to said non-reactive support, said assembling means including a pair of fuser rollers, both of which are heated and at least one of which is common with said pressure rollers.

2. The apparatus of claim 1 further comprising a take-up spool for collecting said web of imaging sheet from said assembling means in a coil.

3. The apparatus of claim 1 further comprising a take-up spool for collecting said intermediate developer sheet from said applying means.

4. The apparatus of claim 1 wherein said imaging sheet support comprises a sheet of substantially transparent polyethylene terephthalate.

5. The apparatus of claim 4 wherein said exposing means includes a source of visible light radiation positioned to radiate through said imaging sheet support to said microcapsules thereon.

6. The apparatus of claim 5 wherein said substrate of said intermediate developer sheet comprises a sheet of aluminized polyethylene terephthalate positioned such that said visible light radiation passing through said imaging sheet support to said microcapsules is reflected back by said intermediate developer sheet to said microcapsules.

7. The apparatus of claim 1 wherein said substrate of said developer-donor sheet comprises a sheet of aluminized polyethylene tereplathalate.

* * * * *